United States Patent
Jiang et al.

(10) Patent No.: US 8,107,014 B2
(45) Date of Patent: Jan. 31, 2012

(54) DIGITAL RECEIVER AND METHOD THEREOF

(75) Inventors: Jeng-Shiann Jiang, Tainan County (TW); Pei-Jun Shih, Tainan County (TW); Kuan-Hung Chen, Tainan County (TW)

(73) Assignee: Himax Media Solutions, Inc., Fonghua Village, Xinshi Dist., Tainan (TW)

( * ) Notice: Subject to any disclaimer, the term of this patent is extended or adjusted under 35 U.S.C. 154(b) by 508 days.

(21) Appl. No.: 12/399,985

(22) Filed: Mar. 9, 2009

(65) Prior Publication Data

US 2010/0225822 A1 Sep. 9, 2010

(51) Int. Cl.
*H04N 5/52* (2006.01)
*H04N 5/44* (2011.01)

(52) U.S. Cl. ................ 348/678; 348/725; 348/726

(58) Field of Classification Search .......... 348/678–686, 348/555, 558, 725–726, 735; 455/232.1, 455/136, 138, 240.1, 339, 247.1, 249.1, 234.1; 341/139, 155; *H04N 5/52, 5/44*

See application file for complete search history.

(56) References Cited

U.S. PATENT DOCUMENTS

| | | | | |
|---|---|---|---|---|
| 6,049,361 A * | 4/2000 | Kim | ............................... | 348/678 |
| 6,459,458 B1 * | 10/2002 | Balaban | ........................ | 348/678 |
| 6,985,192 B1 * | 1/2006 | Bouillet et al. | ................ | 348/735 |
| 7,295,073 B2 * | 11/2007 | Hsieh et al. | .................... | 330/279 |
| 7,522,896 B2 * | 4/2009 | Oshima et al. | ............. | 455/232.1 |

\* cited by examiner

*Primary Examiner* — Trang U Tran

(74) *Attorney, Agent, or Firm* — Winston Hsu; Scott Margo

(57) ABSTRACT

A digital receiver includes an analog front-end circuit, an automatic-gain controller, a compensation circuit, and a demodulator. The analog front-end circuit receives an input signal, adjusts an average amplitude of the input signal, and converts the adjusted input signal to generate a digital signal according to a control signal. The automatic-gain controller is coupled to the analog front-end circuit for generating the control signal feedback to the analog front-end circuit according to the digital signal. The compensation circuit is coupled to the analog front-end circuit for detecting an average amplitude of the digital signal to generate a detecting result and for determining whether to compensate the average amplitude of the digital signal to generate a compensated digital signal according to the detecting result. The demodulator is coupled to the compensation circuit for demodulating the compensated digital signal to generate an output signal.

8 Claims, 4 Drawing Sheets

DIGITAL RECEIVER AND METHOD THEREOF

BACKGROUND OF THE INVENTION

1. Field of the Invention

The present invention relates to a digital receiver and a related method, and more particularly, to a digital TV receiver with an automatic-gain controller and a related method, which uses a detecting and compensating mechanism to compensate the automatic-gain controller before demodulation.

2. Description of the Prior Art

In a digital receiver, such as a digital TV receiver, an automatic-gain controller (AGC) is usually included in order to adjust the amplitude of an input signal automatically into an appropriate range such that the back-end circuits, such as a demodulator, may properly operate.

However, the automatic-gain controller (AGC) only has a small bandwidth (about 1 Hz) and tracks the input signal slowly. If the amplitude of the input signal changes too fast, the automatic-gain controller (AGC) cannot timely react and the amplitude variation will lead to problems at the back-end circuits. Hence, how to overcome such drawbacks becomes an important topic of the field.

SUMMARY OF THE INVENTION

It is one of the objectives of the claimed invention to provide a digital receiver and a related method for compensating the automatic-gain controller to solve the abovementioned problems.

According to one embodiment, a digital receiver is provided. The digital receiver includes an analog front-end circuit, an automatic-gain controller, a compensation circuit, and a demodulator. The analog front-end circuit receives an input signal, adjusts an average amplitude of the input signal, and converts the adjusted input signal to generate a digital signal according to a control signal. The automatic-gain controller is coupled to the analog front-end circuit for generating the control signal feedback to the analog front-end circuit according to the digital signal. The compensation circuit is coupled to the analog front-end circuit for detecting an average amplitude of the digital signal to generate a detecting result and for determining whether to compensate the average amplitude of the digital signal to generate a compensated digital signal according to the detecting result. The demodulator is coupled to the compensation circuit for demodulating the compensated digital signal to generate an output signal.

According to another embodiment, a method for compensating an automatic-gain controller of a digital receiver is provided. The method includes the steps of receiving an input signal, adjusting an average amplitude of the input signal, and converting the adjusted input signal to generate a digital signal according to a control signal of the automatic-gain controller, wherein the control signal is generated according to the digital signal; detecting the average amplitude of the digital signal to generate a detecting result; determining whether to compensate the average amplitude of the digital signal to generate a compensated digital signal according to the detecting result; and demodulating the compensated digital signal to generate an output signal. A compensation control signal is generated only when the detecting result indicates that the average amplitude of the digital signal varies over time, and the average amplitude of the digital signal is compensated to generate the compensated digital signal according to the compensation control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
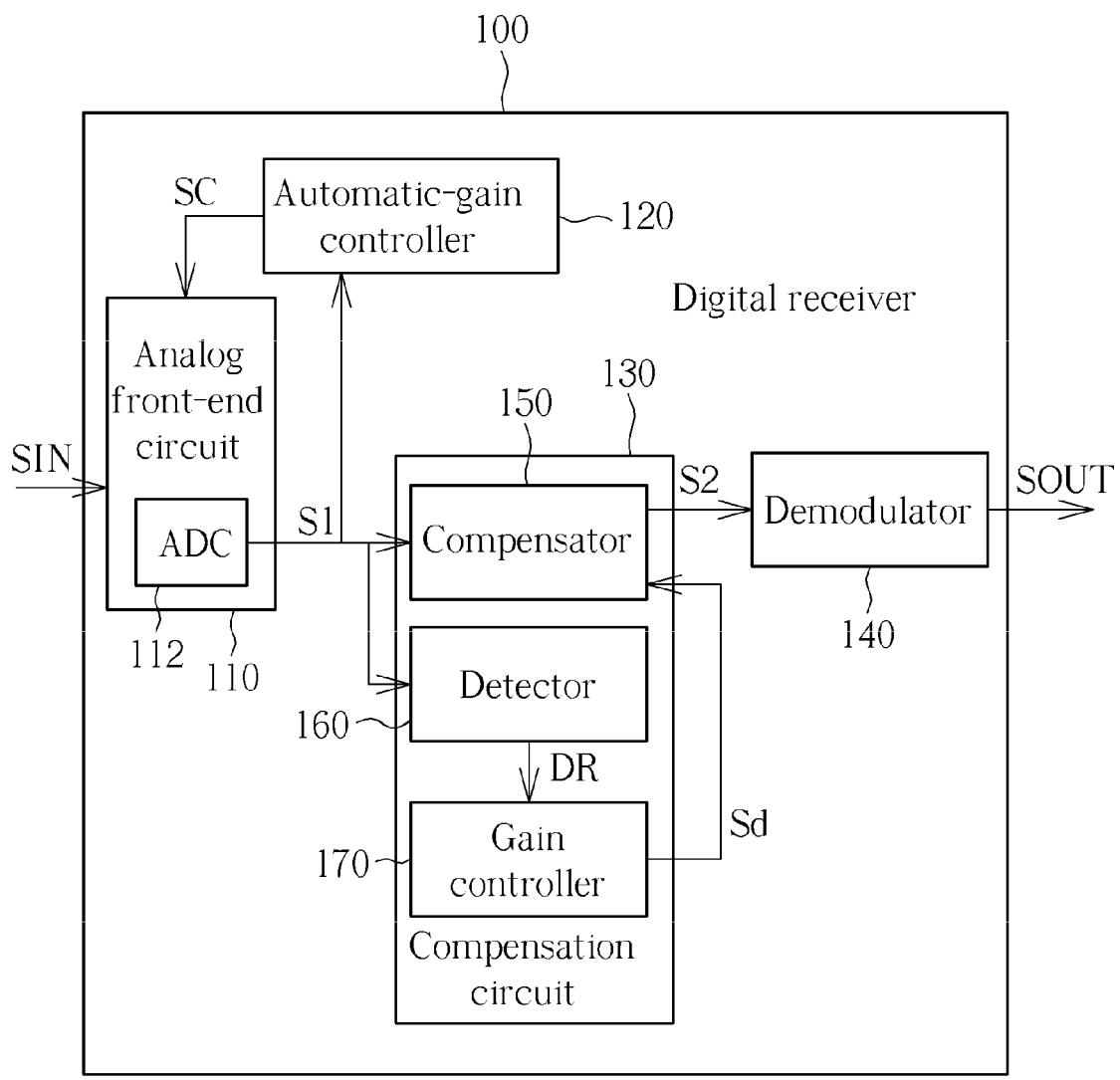
FIG. 1 is a diagram of a digital receiver according to an embodiment of the present invention.

Please refer to FIG. 1. FIG. 1 is a diagram of a digital receiver 100 according to an embodiment of the present invention. In this embodiment, the digital receiver 100 can be a digital TV receiver, but this should not be considered as limitations of the present invention. The digital receiver 100 includes, but is not limited to, an analog front-end circuit 110, an automatic-gain controller 120, a compensation circuit 130, and a demodulator 140. The analog front-end circuit 110 receives the input signal SIN, adjusts the average amplitude of the input signal SIN into an appropriate range according to a control signal SC, and converts the adjusted input signal to generate a digital signal S1. The automatic-gain controller 120 is coupled to the analog front-end circuit 110 for generating the control signal SC feedback to the analog front-end circuit 110 according to the digital signal S1. The compensation circuit 130 is coupled to the analog front-end circuit 110 for providing a detecting and compensating mechanism to compensate the average amplitude of the digital signal S1 to generate a compensated digital signal S2. The demodulator 140 is coupled to the compensation circuit 130 for demodulating the compensated digital signal S2 to generate an output signal SOUT.

In this embodiment, the compensation circuit 130 includes a compensator 150, a detector 160, and a gain controller 170. The detector 160 detects the average amplitude of the digital signal S1 to generate a detecting result DR. The gain controller 170 is coupled to the compensator 150 and the detector 160 for generating a compensation control signal Sd to the compensator 150 according to the detecting result DR. The compensator 150 receives the digital signal S1 and compensates the average amplitude of the digital signal S1 to generate the compensated digital signal S2 according to the compensation control signal Sd. Finally, the compensated digital signal S2 is inputted to the demodulator 140, and is demodulated by the demodulator 140 to generate the output signal SOUT. Please note that the compensation circuit 130 is digitally implemented, but is not limited to this only.

Usually, the average amplitude of the digital signal S1 is fed back to adjust the average amplitude of the input signal SIN to an appropriate range by using the automatic-gain controller 120. For example, without the automatic-gain controller 120 the digital signal S1 outputted from the analog front-end circuit 110 would vary to an extreme extent from a weak to a strong signal. However, the automatic-gain controller 120 only has a small bandwidth (about 1 Hz) and tracks the input signal SIN slowly. If the average amplitude of the input signal SIN changes too fast and the automatic-gain controller 120 cannot timely react, the amplitude variation will lead to problems at the back-end circuits, such as the demodulator 140. Hence, in the present invention, the compensation circuit 130 is added in front of the demodulator 140. Because the added compensation circuit 130 is implemented to have a wider bandwidth and can track the input signal SIN faster, it can keep detecting the average amplitude of the digital signal S1 and compensate the digital signal S1 timely.

Figure 2:
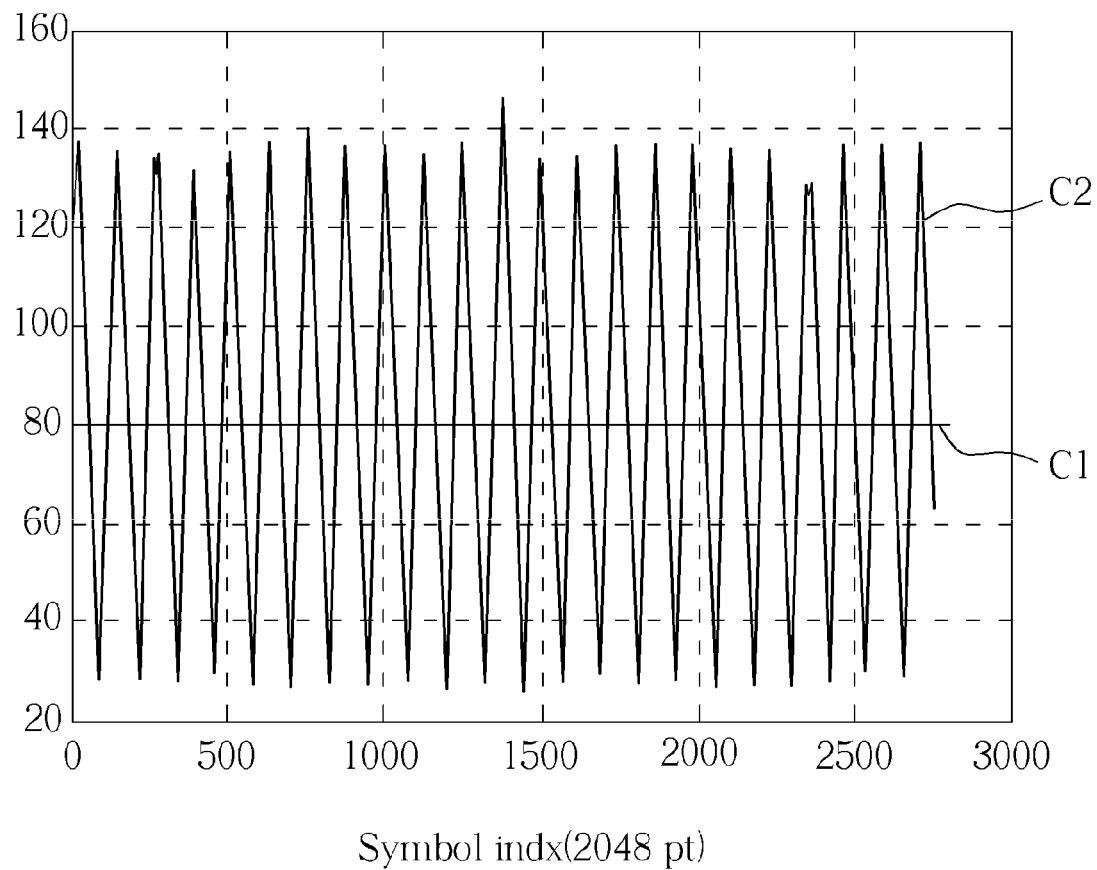
FIG. 2 is a diagram showing the signal outputted to the back-end circuits without the compensation circuit shown in FIG. 1.
Figure 3:
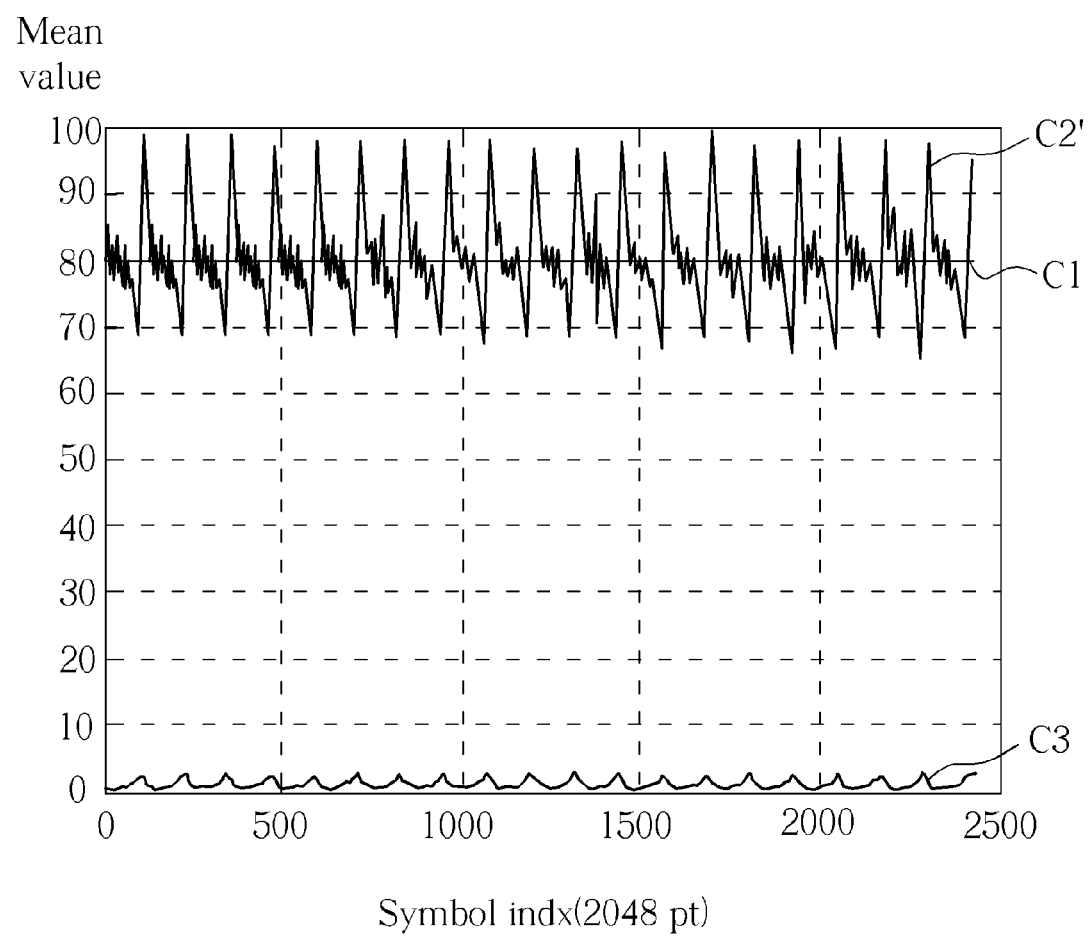
FIG. 3 is a diagram showing the signal outputted to the back-end circuits with the compensation circuit shown in FIG. 1.

Please refer to FIG. 2 and FIG. 3. FIG. 2 is a diagram showing the signal outputted to the demodulator 140 without the compensation circuit 130 shown in FIG. 1, and FIG. 3 is a diagram showing the signal outputted to the demodulator 140 with the compensation circuit 130 shown in FIG. 1. If the input signal SIN is a stable signal, the average amplitude of the digital signal S1 is maintained at 80, for example, which is represented by a curve C1 in FIG. 2. If the input signal SIN has a periodic variation of 100 Hz and the automatic-gain controller (AGC) 120 cannot react timely, the average amplitude of the digital signal S1 also has a periodic variation of 100 Hz, which is represented by a curve C2 in FIG. 2. This periodic amplitude variation may result in problems at the back-end circuits.

As shown in FIG. 3, a cure C3 represents the compensation control signal Sd generated to compensate the average amplitude of the digital signal S1, wherein the compensation control signal Sd periodically compensates the digital signal S1 with 100 Hz to generate the compensated digital signal S2. In addition, a curve C2' represents the average amplitude of the compensated digital signal S2 outputted to the demodulator 140 after compensation. Be compared with FIG. 2, the amplitude variation of the curve C2' after compensation becomes much smaller than that of the curve C2. Therefore, the processing efficiency and the accuracy of the back-end circuits can be improved.

Please note that the abovementioned embodiments are merely examples for describing the present invention, and in no way should be considered to be limitations of the scope of the present invention. Those skilled in the art should appreciate that various modifications of the compensation circuit 130 may be made without departing from the spirit of the present invention, which should also belong to the scope of the present invention.

Figure 4:
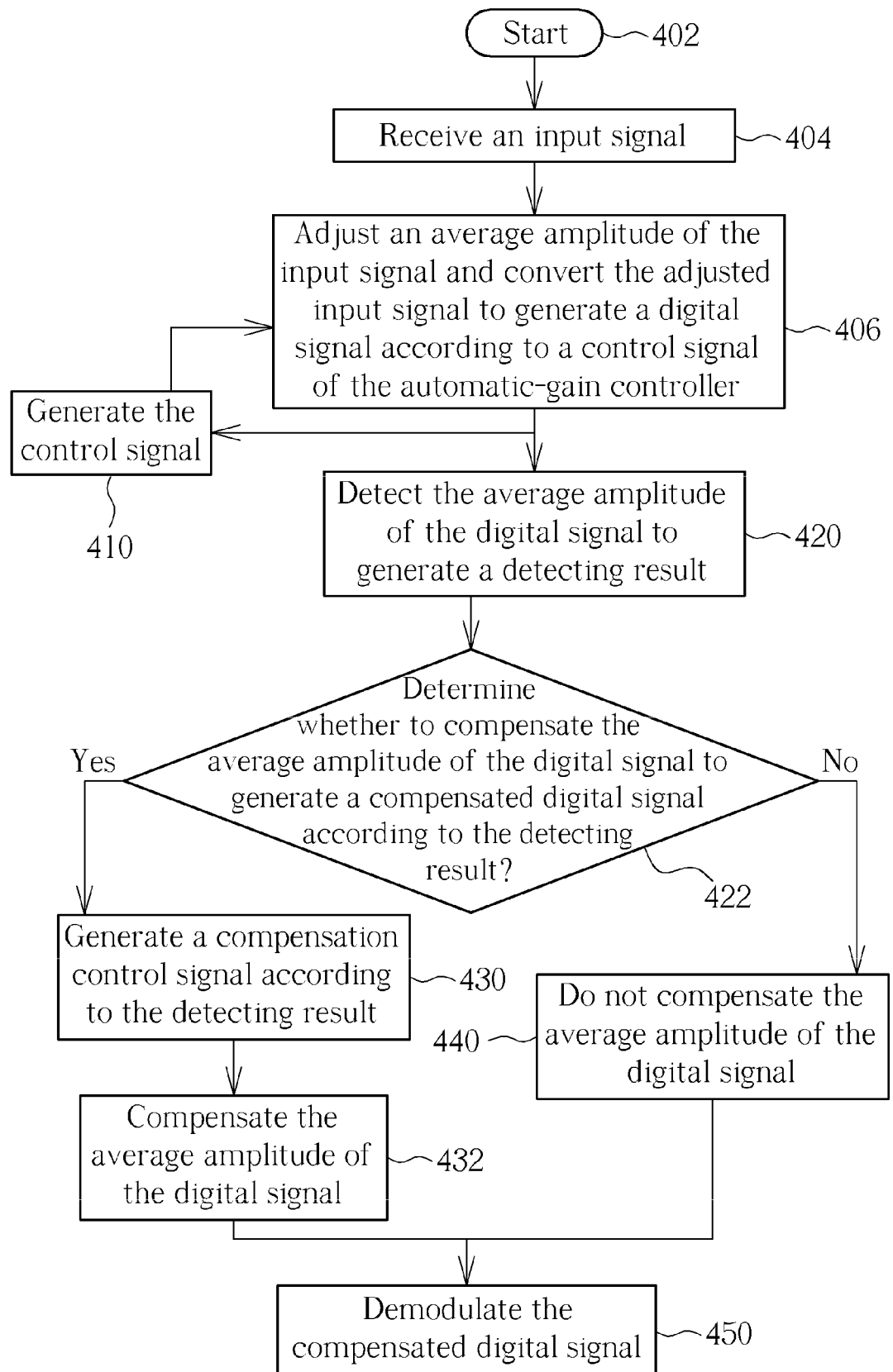
FIG. 4 is a flowchart illustrating a digital receiving method for compensating an automatic-gain controller of a digital receiver according to an exemplary embodiment of the present invention.

Please refer to FIG. 4. FIG. 4 is a flowchart illustrating a digital receiving method for compensating an automatic-gain controller of a digital receiver according to an exemplary embodiment of the present invention. Please note that the following steps are not limited to be performed according to the exact sequence shown in FIG. 4 if a roughly identical result can be obtained. The digital receiving method includes, but is not limited to, the following steps:

Step 402: Start.

Step 404: Receive an input signal. Go to Step 406.

Step 406: Adjust an average amplitude of the input signal and convert the adjusted input signal to generate a digital signal according to a control signal of the automatic-gain controller. Go to the steps 410 and 420.

Step 410: Generate the control signal according to the digital signal. Go back to Step 406.

Step 420: Detect the average amplitude of the digital signal to generate a detecting result. Go to Step 422.

Step 422: Determine whether to compensate the average amplitude of the digital signal to generate a compensated digital signal according to the detecting result. If the detecting result indicates that the average amplitude of the digital signal varies over time, go to Step 430; otherwise, go to Step 440.

Step 430: Generate a compensation control signal according to the detecting result. Go to Step 432.

Step 432: Compensate the average amplitude of the digital signal to generate the compensated digital signal according to the compensation control signal. Go to Step 450.

Step 440: Do not compensate the average amplitude of the digital signal. Go to Step 450.

Step 450: Demodulate the compensated digital signal to generate an output signal.

Please refer to FIG. 4 together with FIG. 1. The following description details how each element operates by collocating the steps shown in FIG. 4 and the elements shown in FIG. 1. In the steps 404~406, the analog front-end circuit 110 receives the input signal SIN, adjusts the average amplitude of the input signal SIN, and converts the adjusted input signal to generate the digital signal S1. In Step 410, the automatic-gain controller (AGC) 120 generates the control signal SC according to the digital signal S1. The following steps 420~440 are executed by the compensation circuit 130. The detector 160 detects the average amplitude of the digital signal S1 to generate the detecting result DR (Step 420). If the detecting result DR indicates that the average amplitude of the digital signal S1 varies over time, the gain controller 170 generates the compensation control signal Sd (Step 430) and then the compensator 150 compensates the average amplitude of the digital signal S1 according to the compensation control signal Sd (Step 432) to generate the compensated digital signal S2. If the average amplitude of the digital signal S1 is stable, the compensator 150 is disabled (Step 440). Finally, the demodulator 140 demodulates the compensated digital signal S2 outputted from the compensation circuit 130 (Step 450) to generate the output signal SOUT.

Provided that substantially the same result is achieved, the steps of the method shown in FIG. 4 need not be in the exact order shown and need not be contiguous: other steps can be intermediate.

The abovementioned embodiments are presented merely for describing the present invention, and in no way should be considered to be limitations of the scope of the present invention. In summary, the present invention provides an apparatus and a related method of a detecting and compensating mechanism for compensating an automatic-gain controller of a digital receiver. By adopting this mechanism disclosed in the present invention, the compensation circuit 130 can keep detecting the average amplitude of the digital signal S1 and compensate the digital signal S1 timely. Even if the average amplitude of the input signal SIN changes too fast and the automatic-gain controller 120 cannot timely react, this mechanism can solve the problems mentioned above. Therefore, the processing efficiency and the accuracy of the back-end circuits can be improved.

Those skilled in the art will readily observe that numerous modifications and alterations of the device and method may be made while retaining the teachings of the invention.

What is claimed is:

1. A digital receiver, comprising:
   an analog front-end circuit, for receiving an input signal, adjusting an average amplitude of the input signal and converting the adjusted input signal to generate a digital signal according to a control signal;
   an automatic-gain controller (AGC), coupled to the analog front-end circuit, for generating the control signal feedback to the analog front-end circuit according to the digital signal;
   a compensation circuit, coupled to the analog front-end circuit, for detecting an average amplitude of the digital signal to generate a detecting result and for determining whether to compensate the average amplitude of the digital signal to generate a compensated digital signal according to the detecting result, wherein the compensation circuit is digitally implemented to have a wider bandwidth than that of the automatic-gain controller; and
   a demodulator, coupled to the compensation circuit, for demodulating the compensated digital signal to generate an output signal.

2. The digital receiver of claim 1, wherein the compensation circuit comprises:
   a compensator, for receiving the digital signal and for compensating the average amplitude of the digital signal to generate the compensated digital signal according to a compensation control signal;
   a detector, for detecting the average amplitude of the digital signal to generate the detecting result; and
   a gain controller, coupled to the compensator and the detector, for generating the compensation control signal to the compensator according to the detecting result.

3. The digital receiver of claim 2, wherein the gain controller generates the compensation control signal to the compensator only when the detecting result indicates that the average amplitude of the digital signal varies over time.

4. The digital receiver of claim 1, wherein the digital receiver is a digital TV receiver.

5. A digital receiving method for compensating an automatic-gain controller of a digital receiver, comprising:
   receiving an input signal, adjusting an average amplitude of the input signal, and converting the adjusted input signal to generate a digital signal according to a control signal of the automatic-gain controller, wherein the control signal is generated based on the digital signal;
   detecting the average amplitude of the digital signal to generate a detecting result;
   determining whether to compensate the average amplitude of the digital signal to generate a compensated digital signal according to the detecting result, wherein compensating the average amplitude of the digital signal is digitally implemented to operate faster than the automatic-gain controller; and
   demodulating the compensated digital signal to generate an output signal.

6. The method of claim 5, wherein the step of determining whether to compensate the average amplitude of the digital signal to generate the compensated digital signal according to the detecting result comprises:
   generating a compensation control signal according to the detecting result; and
   compensating the average amplitude of the digital signal to generate the compensated digital signal according to the compensation control signal.

7. The method of claim 6, wherein the compensation control signal is generated only when the detecting result indicates that the average amplitude of the digital signal varies over time.

8. The method of claim 6, wherein the digital receiver is a digital TV receiver.

* * * * *